United States Patent
Torii et al.

(10) Patent No.: US 11,253,939 B2
(45) Date of Patent: Feb. 22, 2022

(54) SCREEN PRINTING MACHINE (71) Applicant: FUJI CORPORATION, Chiryu (JP)

(72) Inventors: Atsushi Torii, Toyota (JP); Akira Furuichi, Kariya (JP)

(73) Assignee: FUJI CORPORATION, Chiryu (JP)

( * ) Notice: Subject to any disclaimer, the term of this patent is extended or adjusted under 35 U.S.C. 154(b) by 294 days.

(21) Appl. No.: 16/472,450

(22) PCT Filed: Dec. 26, 2016

(86) PCT No.: PCT/JP2016/088790
§ 371 (c)(1),
(2) Date: Jun. 21, 2019

(87) PCT Pub. No.: WO2018/122938
PCT Pub. Date: Jul. 5, 2018

(65) Prior Publication Data
US 2021/0129247 A1    May 6, 2021

(51) Int. Cl.
*B23K 3/00*    (2006.01)
*B23K 3/06*    (2006.01)
(Continued)

(52) U.S. Cl.
CPC .......... *B23K 3/0607* (2013.01); *B23K 1/0016* (2013.01); *B23K 3/087* (2013.01);
(Continued)

(58) Field of Classification Search
CPC .... B23K 3/0607; B23K 1/0016; B23K 3/087; B23K 2101/42; B23K 35/025;
(Continued)

(56) References Cited

U.S. PATENT DOCUMENTS 5,113,788 A    5/1992 Izumi et al.
5,201,452 A *  4/1993 Takahashi ................ B23K 3/06
                                                            101/114

(Continued)

FOREIGN PATENT DOCUMENTS

JP    2-91544 A    3/1990
JP    3-79347 A    4/1991
(Continued)

OTHER PUBLICATIONS

International Search Report dated Mar. 21, 2017 in PCT/JP2016/088790 filed Dec. 26, 2016.

*Primary Examiner* — Kiley S Stoner
(74) *Attorney, Agent, or Firm* — Oblon, McClelland, Maier & Neustadt, L.L.P.

(57) ABSTRACT

A screen printing machine configured to print solder onto a surface of a circuit board using a screen mask. The screen printing machine is provided with: a screen mask arranged at a top side of the circuit board; a box member arranged at an underside of the circuit board including a space that is closed by the circuit board; a negative pressure generator connected to the space of the box member and configured to create negative pressure inside the space; a sensor configured to detect a pressure inside the space; and a control device configured to control the negative pressure generator based on the pressure detected by the sensor.

8 Claims, 5 Drawing Sheets

(51) Int. Cl.
  *B23K 1/00* (2006.01)
  *B23K 3/08* (2006.01)
  *B23K 101/42* (2006.01)
  *H05K 3/30* (2006.01)

(52) U.S. Cl.
  CPC .......... *B23K 2101/42* (2018.08); *H05K 3/305* (2013.01); *H05K 2203/0104* (2013.01)

(58) Field of Classification Search
  CPC ................ B23K 3/0638; H05K 3/305; H05K 2203/0104; B41P 2215/134; B41F 15/26; B41F 15/0881; B41F 15/08; B41F 15/20
  USPC ................ 228/248.1–248.5, 33, 41
  See application file for complete search history.

(56) References Cited

U.S. PATENT DOCUMENTS

| | | | | |
|---|---|---|---|---|
| 2004/0035306 A1* | 2/2004 | Onishi | ................ | H05K 3/1216 101/123 |
| 2006/0157540 A1* | 7/2006 | Sumita | ................ | H05K 3/3478 228/180.22 |
| 2010/0288818 A1* | 11/2010 | Kim | ...................... | B23K 3/0623 228/41 |
| 2010/0291289 A1* | 11/2010 | Kim | ...................... | H05K 3/1233 427/98.4 |
| 2011/0297020 A1* | 12/2011 | Tanaka | .................. | H05K 3/1216 101/126 |
| 2013/0106041 A1* | 5/2013 | Noda | ...................... | B41F 15/36 269/58 |
| 2015/0090770 A1* | 4/2015 | Mantani | ............. | B23K 37/0408 228/102 |
| 2015/0136326 A1* | 5/2015 | Mantani | .................. | B41F 15/16 156/387 |
| 2015/0183209 A1* | 7/2015 | Uchida | ................... | B41F 15/42 101/123 |
| 2015/0366079 A1* | 12/2015 | Matsuda | .............. | B23K 1/0016 219/72 |
| 2017/0290099 A1* | 10/2017 | Takebayashi | .......... | H05K 1/028 |
| 2017/0348786 A1* | 12/2017 | Nakamura | ........... | H05K 3/1233 |
| 2018/0139875 A1* | 5/2018 | Yoo | .................... | H05K 13/0061 |
| 2018/0162118 A1* | 6/2018 | Hirukawa | ............. | B41F 27/005 |
| 2019/0118525 A1* | 4/2019 | Mantani | ............... | B41F 15/0881 |
| 2019/0224960 A1* | 7/2019 | Kato | ................... | B41F 15/0881 |

FOREIGN PATENT DOCUMENTS

| | | | |
|---|---|---|---|
| JP | 4-164390 A | | 6/1992 |
| JP | 2004322427 A | * | 11/2004 |
| JP | 2015-214088 A | | 12/2015 |

* cited by examiner

FIG. 5

SCREEN PRINTING MACHINE

TECHNICAL FIELD

Technology of the present disclosure relates to a screen printing machine that prints solder onto a surface of a circuit board using a screen mask.

BACKGROUND ART

A screen printing machine prints solder onto, for example, portions of a surface of a circuit board on which electronic components are to be mounted. When printing solder onto a circuit board using a screen printing machine, a screen mask is closely contacted against the circuit board. The screen mask is provided with holes at positions corresponding to the arrangement of electronic components to be mounted on the circuit board. Solder is transferred from the upper surface of the screen mask (that is, the surface at which the circuit board is not arranged) onto the circuit board by squeezing solder through the holes. Thus, if the screen mask is not completely flush against the circuit board, it is not possible to perform accurate printing on the circuit board. In a state in which the screen mask is not completely flush against the circuit board, for example, warping of the circuit board or the screen mask may occur. For example, with the screen printing machine disclosed in JP-A-2015-214088, a negative pressure generator is provided for ensuring that the screen mask is flush against the circuit board. By the negative pressure generator generating negative pressure, the warping of the circuit board or the screen mask is corrected, and the screen mask is made to be completely flush against the circuit board. The size of the negative pressure generated by the negative pressure generator is set by an operator.

BRIEF SUMMARY

Technical Problem

In recent years, circuit boards on which screen printing is to be performed have become smaller, as have the electronic components to be mounted on the circuit boards, which means that the distance between electronic components to be mounted on the circuit boards has become smaller. Therefore, the holes in the screen mask are getting smaller, as is the distance between adjacent holes. With the screen printing machine of JP-A-2015-214088, at the same time as ensuring that the screen mask is flush against the circuit board using a negative pressure generator, the negative pressure encourages solder to enter the holes provided in the screen mask. As a result, if the generated negative pressure is too large, the solder printed on the circuit board becomes smeared, thereby worsening printing quality. On the other hand, if the negative pressure generated is too small, not enough solder is printed on the circuit board. With conventional machines, because it is necessary for an operator to adjust the negative pressure generated by a negative pressure generator (that is, to adjust operating conditions of the negative pressure generator) based on their own experience, it requires a lot of lot work to perform adjustment to an appropriate amount of negative pressure. Disclosed herein is technology for stably transferring solder to a circuit board that does not require an operator to perform negative pressure adjustment work.

Means For Solving the Problem

The screen printing machine of the present disclosure is configured to print solder onto a surface of a circuit board using a screen mask. The screen printing machine is provided with: a screen mask arranged at a topside of the circuit board; a box member arranged at an underside of the circuit board including a space that is closed by the circuit board; a negative pressure generator connected to the space of the box member and configured to create negative pressure inside the space; a sensor configured to detect a pressure inside the space; and a control device configured to control the negative pressure generator based on the pressure detected by the sensor.

The above screen printing machine is provided with a sensor configured to detect a pressure value of a space at the underside of the circuit board, so can therefore detect the negative pressure applied to the underside of the circuit board. Also, by controlling the negative pressure inside the space based on the pressure value detected by the sensor, it is possible to stably control the negative pressure inside the space. Accordingly, by setting the negative pressure value according to the solder printing pattern of the screen mask, it is possible to stably print solder onto the circuit board. Further, because it is sufficient to simply set the negative pressure value, there is no need for an operator to perform adjustment work on the operating conditions of the negative pressure generator.

DESCRIPTION OF EMBODIMENTS

The main features of embodiments are described below as examples of the disclosure. Note that, technical elements described in this specification and in the drawings exhibit technical utility alone or in various combinations, and are not limited to the combination of the described aspects of the application.

Characteristic 1

A screen printing machine of the present disclosure may be provided with an air flow path connecting the space of the box member and the negative pressure generator, and an adjustment valve arranged inside the air flow path and configured to adjust the open area of the air flow path. The control device may be configured to control the adjustment valve based on the pressure detected by the sensor. According to such a configuration, the air amount ejected from the space of the box member is adjusted by the adjustment valve, such that the pressure inside the space is adjusted.

Characteristic 2

The screen printing machine of the present disclosure may be further provided with an input section configured to receive an input of a set pressure value. The control device may control the negative pressure generator such that a pressure value of the pressure detected by the sensor is the set pressure value. According to such a configuration, when the set pressure value is entered, the negative pressure generator is controlled such that the pressure inside the space is the set pressure value. Thus, it is possible to favorably maintain the pressure inside the space at the set pressure value.

Characteristic 3

A screen printing machine of the present disclosure may be further provided with: a clamp device configured to clamp the circuit board loaded on an upper surface of the box member such that the circuit board cannot move relative to the box member, a raising and lowering device configured to raise and lower the circuit board loaded on the upper surface of the box member with respect to the screen mask, and a printing device configured to print solder onto the circuit board via the screen mask in a state with the screen mask arranged on the surface of the circuit board loaded on the upper surface of the box member. The set pressure value may be classified as a first set value set as the pressure value inside the space when the circuit board is clamped by the clamp device, a second set value set as the pressure value inside the space when solder is being printed onto the circuit board by the printing device, and a third set value set as the pressure value inside the space when the circuit board is separated from the screen mask by the raising and lowering device. The input section may be configured to receive an input of the first set value, the second set value, and the third set value. The control device may be configured to perform control such that the pressure inside the space when the circuit board is clamped by the clamp device makes the pressure value inside the space the first set value, perform control such that the pressure inside the space when solder is being printed onto the circuit board by the printing device makes the pressure value inside the space the second set value, and perform control such that the pressure inside the space when the circuit board is separated from the screen mask by the raising and lowering device makes the pressure value inside the space the third set value. According to such a configuration, it is possible to control the pressure inside the space to an appropriate pressure value during each of clamping, printing, and separation.

Characteristic 4

The screen printing machine of the present disclosure may be further provided with an error determining section configured to determine an error based on the pressure value detected by the sensor and the set pressure value. According to such a configuration, it is possible to determine an error by comparing the pressure value detected by the sensor and the set pressure value.

Characteristic 5

With a screen printing machine of the present disclosure, the error determining section may be configured to determine the error when a difference between the pressure value detected by the sensor and the set pressure value exceeds a predetermined set range. According to such a configuration, it is possible to monitor the pressure value inside the space using the sensor, and to detect an error when the difference with the set pressure value is large.

Characteristic 6

The screen printing machine of the present disclosure may be further provided with a memory section configured to memorize the pressure value detected by the sensor during printing processing each time solder is printed on the circuit board. According to such a configuration, by memorizing the value detected by the sensor for each circuit board, it is possible to manage the solder printing quality for each board.

Characteristic 7

The screen printing machine of the present disclosure may be further provided with a solder amount acquiring section configured to acquire information related to an amount of solder printed on the circuit board. The control device may be configured to control the negative pressure generator also based on the information acquired by the solder amount acquiring section. According to such a configuration, the supplied negative pressure can be controlled also based on the amount of solder used in printing (that is, the amount of solder printed on the circuit board) as well as the pressure value detected by the sensor. Thus, it is possible to stably print solder even if the state of the screen mask changes over time.

Embodiments

Figure 1:
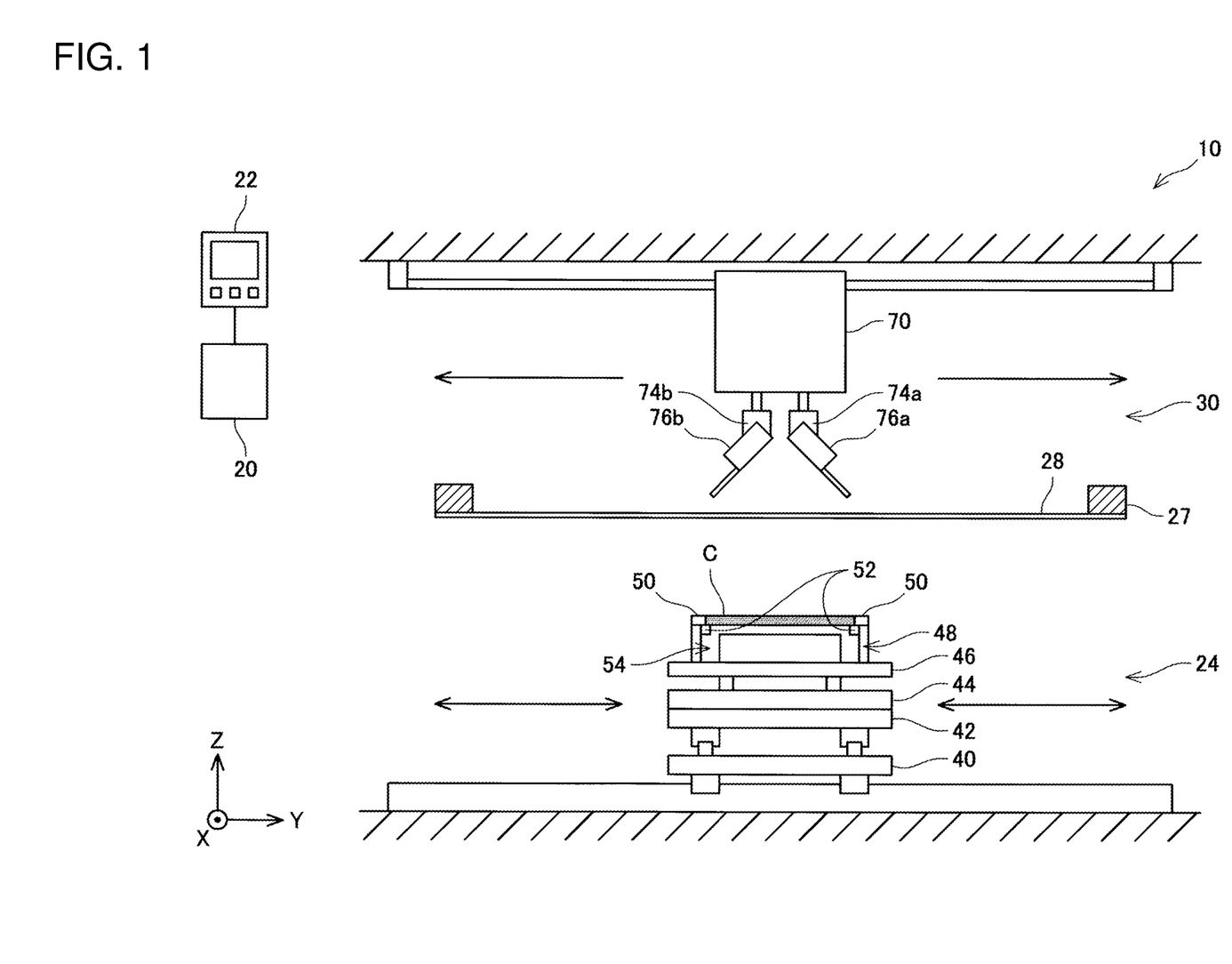
FIG. 1 shows an outline of the configuration of a screen printing machine of an embodiment.

Screen printing machine 10 of an embodiment is described below. As shown in FIG. 1, screen printing machine 10 is provided with circuit board positioning device 24, negative pressure generating mechanism 54, screen mask 28, squeegee device 30, control device 20, and interface device 22. Screen printing machine 10 receives circuit board C from the upstream side of a production line, and unloads the circuit board C to a downstream side of the production line after screen printing desired solder onto the circuit board C. Note that, in the descriptions below, for screen printing machine 10, the conveyance direction of circuit board C is referred to as the X direction, the direction perpendicular to the X direction in a horizontal plane is referred to as the Y direction, and the direction perpendicular to the X direction and the Y direction is referred to as the Z direction. Further, with circuit board C, the upper surface of the circuit board C during conveyance, that is, the surface on which screen printing is performed (+Z side surface) is referred to as the top side, and the opposite side to that side (−Z side surface) is referred to as the bottom side.

Circuit board positioning device 24 is provided with Y-direction moving mechanism 40, X-direction moving mechanism 42, rotating mechanism 44, raising and lowering mechanism 46, X-direction conveyance mechanism 48, and clamp configuration 50.

Y-direction moving mechanism 40 is supported on a base of screen printing machine 10. Y-direction moving mechanism 40 is able to move in the Y direction relatively with respect to the base of screen printing machine 10 by the driving of an actuator (not shown).

X-direction moving mechanism 42 is supported on Y-direction moving mechanism 40. X-direction moving mechanism 42 is able to move relatively in the X direction with respect to Y-direction moving mechanism 40 by the driving of an actuator (not shown).

Rotating mechanism 44 is supported on X-direction moving mechanism 42. Rotating mechanism 44 is able to rotate relatively around the Z-axis with respect to X-direction moving mechanism 42 by the driving of a motor (not shown).

Raising and lowering mechanism 46 is supported on rotating mechanism 44. Raising and lowering mechanism 46 is able to move relatively in the Z direction with respect to rotating mechanism 44 by the driving of an actuator (not shown). Note that, raising and lowering mechanism 46 is an example of a "raising and lowering device".

X-direction conveyance mechanism 48 and clamp mechanism 50 are supported on raising and lowering mechanism 46. X-direction conveyance mechanism 48 is provided with pair of conveyor belts 52 arranged in the X direction, and servo motors (not shown) for driving each of the conveyor belts. Both edges of circuit board C in the Y direction are loaded on the pair of conveyor belts 52, and by the driving of the servo motors, circuit board C is conveyed in the X direction. The distance between the pair of conveyor belts 52 can be adjusted in accordance with the size of the circuit board C. Clamp mechanism 50 is able to hold circuit board C at a desired width by sandwiching both edges of circuit board C in the Y direction. Note that, clamp mechanism 50 is an example of a "clamp device".

Figure 2:
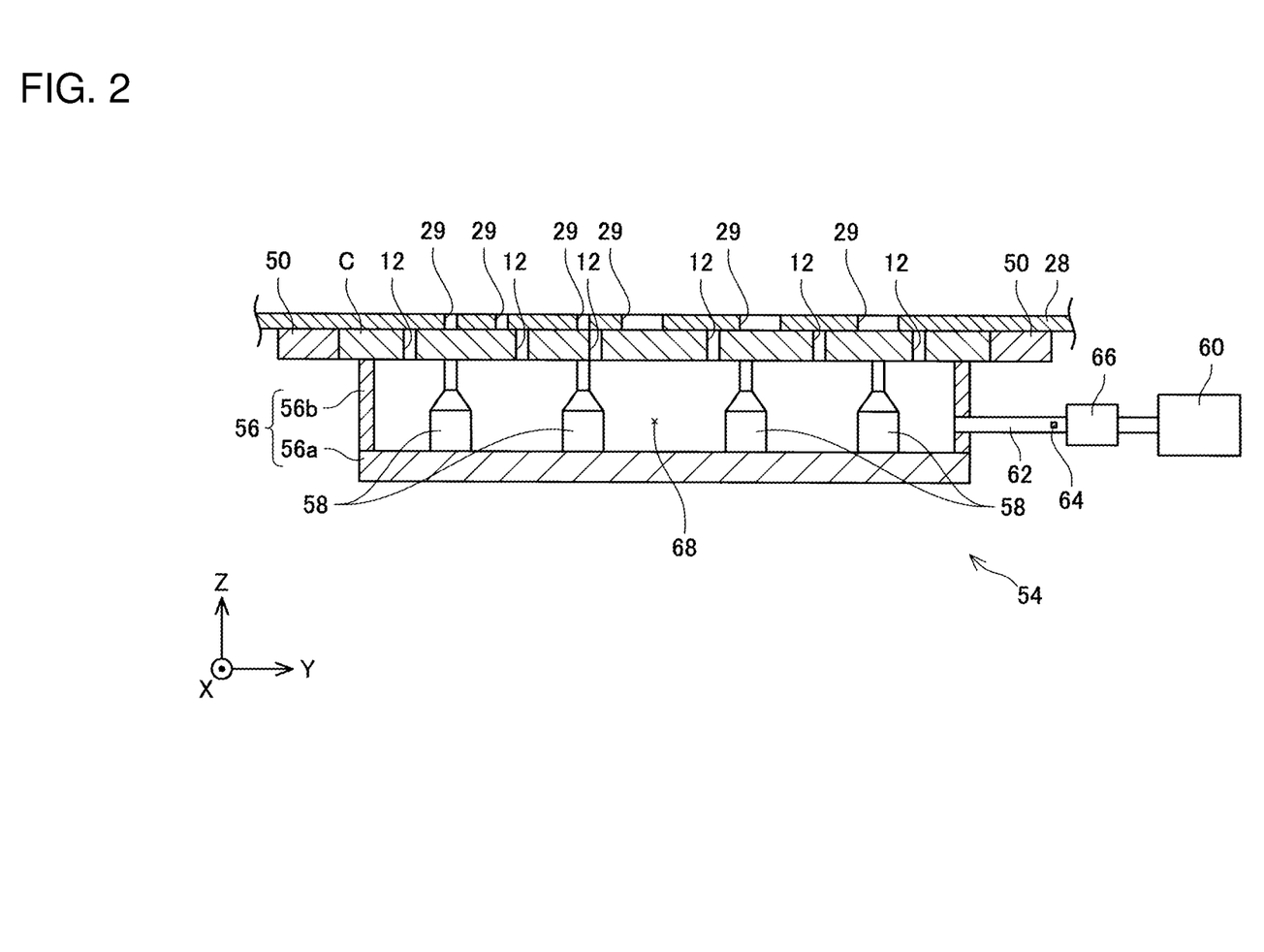
FIG. 2 is a cross section showing an outline of the configuration of a negative pressure generating mechanism.

Negative pressure generating mechanism 54 will be described with reference to FIG. 2. FIG. 2 shows a state in which negative pressure generating mechanism 54 is fixing an underside of circuit board C, and the top surface of circuit board C is contacting screen mask 28. Note that, in FIG. 2, raising and lowering mechanism 46 and conveyor belts 52 are not shown. As shown in FIG. 2, negative pressure generating mechanism 54 is provided with box member 56, multiple support pins 58, negative pressure generator 60, air flow path 62, sensor 64, and adjustment valve 66.

Box member 56 is provided with bottom wall 56a and side wall 56b. Bottom wall 56a is supported on raising and lowering mechanism 46 (refer to FIG. 1). Bottom wall 56a is allowed to move relatively in the Z direction with respect to raising and lowering mechanism 46 by the driving of an actuator (not shown). Side wall 56b is fixed at the lower edge to bottom wall 56a and extends vertically from side wall 56a (that is, in the +Z direction). The Z-direction dimension of side wall 56b is a uniform value. When bottom wall 56a is moved up and the top end of side wall 56b contacts circuit board C, space 68 is formed by bottom wall 56a, side wall 56b, and circuit board C.

Support pins 58 are supported on bottom wall 56a. The multiple support pins 58 are arranged at intervals on bottom wall 56a. The arrangement positions of the multiple support pins are changeable in accordance with the circuit pattern on the circuit board C that is the target. The Z-direction dimension of each support pin 58 is approximately the same as the Z-direction dimension of side wall 56b. Support pins 58 contact the underside of the circuit board C held by clamp mechanism 50 to support the underside of the circuit board C.

Negative pressure generator 60 is connected to space 68 via air flow path 62. Negative pressure generator 60, for example, is a vacuum pump that creates negative pressure inside space 68 by sucking air from space 68. On-off control of negative pressure generator 60 is controlled by control device 20, and when negative pressure generator 60 is turned on, negative pressure generator 60 operates at a uniform speed. Note that, negative pressure generator 60 may be any type of device capable of creating negative pressure inside space 68, for example, a ring blower.

Sensor 64 and adjustment valve 66 are provided inside air flow path 62. Sensor 64 is a pressure sensor arranged closer to the space 68 side than adjustment valve 66 and detects the pressure inside space 68. In other words, sensor 64 detects the pressure inside space 68 in which negative pressure is created by negative pressure generator 60.

Adjustment valve 66 adjusts the flow path area of air flow path 62. Examples of items that can be used as adjustment valve 66 are a regulator or an electropneumatic valve for which the opening amount can be adjusted. Adjustment valve 66 is controlled by control device 20, and by controlling adjustment valve 66, the air flow amount that negative pressure generator 60 sucks from space 68 is adjusted. Note that, with the present embodiment, the flow amount of air sucked from space 68 by negative pressure generator 60 is adjusted by adjustment valve 66, but the configuration is not limited to this. For example, control device 20 may adjust the flow amount of air sucked from space 68 by adjusting the output of negative pressure generator 60.

Screen mask 28 is a metal plate member formed in a rectangle, and is supported at its four edges by mask support frame 27 (refer to FIG. 1) to be at a fixed position relative to the base of screen printing machine 10. Apertures 29 (refer to FIG. 2) are formed in a central section of screen mask 28 corresponding to the pattern into which solder is to be printed onto circuit board C. The apertures formed in screen mask 28 are referred to below as the printing pattern.

As shown in FIG. 1, squeegee device 30 is provided with Y-direction moving mechanism 70, squeegee heads 74a, 74b, and squeegees 76a and 76b. Note that, squeegee device 30 is an example of a "printing device".

Y-direction moving mechanism 70 is supported on the base of screen printing machine 10. Y-direction moving mechanism 70 is able to move in the Y direction relatively with respect to the base by the driving of an actuator (not shown).

Squeegee heads 74a and 74b are supported on Y-direction moving mechanism 70. Squeegee heads 74a and 74b are each able to move relatively in the Z direction with respect to Y-direction moving mechanism 70 by the driving of an actuator (not shown).

Squeegee 76a is supported by squeegee head 74a. Squeegee 76a is tiltable with respect to squeegee head 74a by the driving of a servo motor (not shown). Squeegee 76b is supported by squeegee head 74b. Squeegee 76b is tiltable with respect to squeegee head 74b by the driving of a servo motor (not shown). Squeegees 76a and 76b squeegee the solder supplied on the upper surface of screen mask 28 from a solder supply device (not shown) into the printing pattern.

Figure 3:
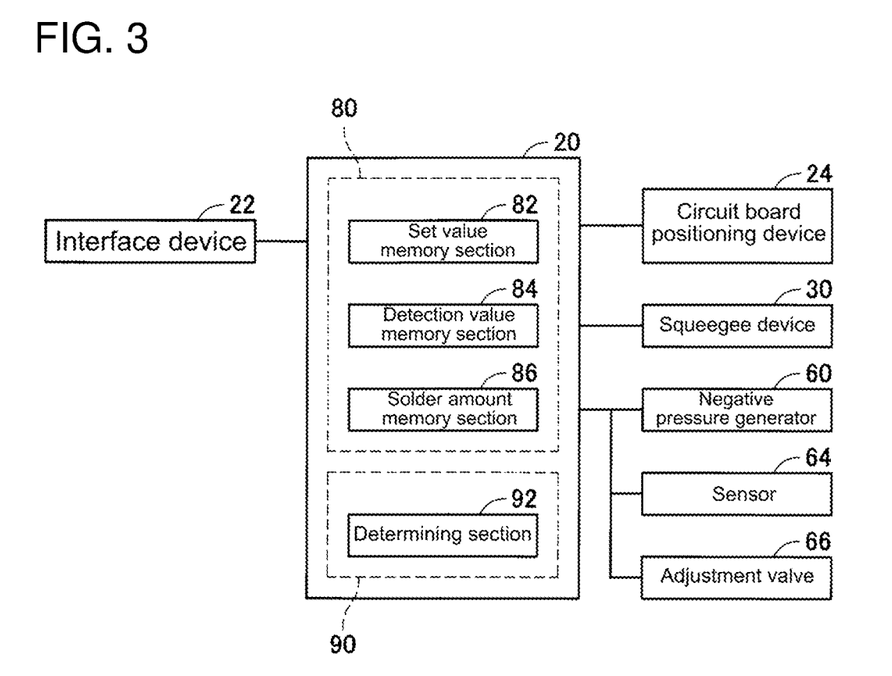
FIG. 3 is a block diagram showing functions of a control device.

As shown in FIG. 3, control device 20 is configured using a computer including memory 80 and CPU 90. Further, control device 20 is provided with a communication device that communicates with a production management computer (not shown) that performs overall management of operation of the production line. Control device 20 controls operation of configuration elements of screen printing machine 10 in accordance with instructions from the production management computer. Also, control device 20 sends data showing the state of solder printing work at screen printing machine 10 to the production management computer.

Provided in memory 80 are set value memory section 82, detection value memory section 84, and solder amount memory section 86. Set value memory section 82 memorizes a set value of the pressure inside space 68 for each process during printing processing by screen printing machine 10 (also referred to as set pressure value), and an operation reference time of the negative pressure generator indicating the time from turning on negative pressure generator 60 until the pressure inside space 68 reaches the set pressure value (also referred to as a set time). The set pressure value and the set time are memorized in set value memory section 82 by an operator performing input via interface device 22. Further, the set pressure value and the set time may be calculated by control device 20 based on information memorized in detection value memory section 84 and information memorized in solder amount memory section 86 (the information being described later). Set value memory section 82 memorizes: a set value of the pressure inside space 68 in a state in which circuit board C is clamped by clamp mechanism 50 (also referred to as during clamping) (the set value also referred to as a first set value) and the corresponding set time; a set value of the pressure inside space 68 when solder on screen mask 28 is being printed onto circuit board C (also referred to as during printing) (the set value also referred to as a second set value) and the corresponding set time; and a set value of the pressure inside space 68 when circuit board C is separated from screen mask 28 (also referred to as during separation) (the set value also referred to as a third set value) and the corresponding set time.

The first set value is a value for correcting warpage in circuit board C in a state with circuit board C clamped by clamp mechanism 50. If circuit board C is warped, when circuit board C contacts the screen mask 28, a gap may arise between the circuit board C and screen mask 28. If there is a gap between circuit board C and screen mask 28, solder is not printed at the appropriate positions on circuit board C. In a state with circuit board C clamped by clamp mechanism 50 and circuit board C supported from underneath by support pins 58, by creating negative pressure inside space 68, it is possible to correct warpage of circuit board C. However, with circuit board C, because multiple holes 12 are provided (refer to FIG. 2), when negative pressure generator 60 is turned on, air enters space 68 through the multiple holes 12. Despite this, by adjusting negative pressure generator 60 such that the air flow sucked from space 68 by negative pressure generator 60 is greater than the air flow entering via the multiple holes 12, it is possible to create negative pressure inside space 68. By making the pressure inside space 68 a first set value, the appropriate negative pressure is created in space 68, and warpage of circuit board C can be corrected.

A second set value is a pressure value such that an appropriate amount of solder is squeezed through apertures 29 of screen mask 28. For example, if apertures 29 of screen mask 28 are small, there are cases in which not enough solder on the upper surface of screen mask 28 is squeezed through apertures 29 by the squeegee only. If negative pressure is created inside space 68, sufficient solder squeegeed on the upper surface of screen mask 28 is squeezed through apertures 29. By setting the pressure inside space 68 to the second set value, it is possible to squeeze an appropriate amount of solder through apertures 29.

A third set value is a pressure value such that, when circuit board C is separated from screen mask 28, an appropriate amount of solder is transferred to circuit board C. For example, if apertures 29 of screen mask 28 are small, it becomes more difficult to squeeze solder through apertures 29 onto circuit board C. If negative pressure is created inside space 68 when circuit board C is separated from screen mask 28, it is possible to easily transfer solder squeezed through apertures 29 onto circuit board C. By making the pressure inside space 68 a third set value, it is possible to transfer an appropriate amount of solder onto circuit board C.

Detection value memory section 84 memorizes a pressure value inside space 68 detected by sensor 64 each time solder is printed onto circuit board C. Also, pressure values detected for each stage during printing processing are memorized in detection value memory section 84. That is, memorized in detection value memory section 84 are: a pressure value detected by sensor 64 during clamping; a pressure value detected by sensor 64 during printing; and a pressure value detected by sensor 64 during separation. By detection value memory section 84 memorizing a pressure value inside space 68 each time solder is printed on circuit board C, it is possible to print the same amount of solder on circuit board C when printing on the same kind of board, thus enabling stable printing quality for the same type of board. Also, for the same types of multiple circuit boards C, by storing a pressure value inside space 68 for each of the above stages (clamping, printing, and separation), it is possible to manage the printing quality of each circuit board C.

Solder amount memory section 86 memorizes information related to an amount of solder printed on circuit board C by screen printing machine 10. Information related to the amount of solder printed on circuit board C is, for example, the amount of solder printed on circuit board C by a single printing performed by screen printing machine 10. The amount of solder printing in a single printing, for example, may be calculated by measuring the weight of the solder container. That is, the amount may be calculated by subtracting the weight of the solder container after printing from the weight of the solder container before printing. Note that, the weight of the solder container may be measured using a load cell or the like. Information related to the weight of the solder printed onto circuit board C is memorized in solder amount memory section 86 by being acquired from a production management computer or a supply device, which is not shown. Note that, control device 20 may calculate a set pressure value inside space 68 based on the information. For example, control device 20 may calculate a pressure set value inside space 68 for each stage (clamping, printing, and separate) based on the information related to the solder amount memorized in solder amount memory section 86 and information related to the detection value memorized in detection value memory section 84. That is, control device 20, for the same type of circuit board C, controls negative pressure generator 60 and adjustment valve 66 based on the detection value memorized in detection value memory section 84 such that the same amount of solder is printed as the solder amount memorized in solder amount memory section 86. By calculating the set pressure value based on the information memorized in solder amount memory section 86, for example, even in a case in which the optimal operating conditions of negative pressure generator 60 changes due to changes over time in each section of screen printing machine 10, the operation conditions of negative pressure generator 60 can be changed in accordance with those changes over time. As a result, it is possible to stably printing over a long period the same amount of solder onto circuit boards C when printing onto the same type of circuit board C. Thus, it is possible to achieve stable printing quality for circuit board C.

A calculating program is memorized on memory 80, and by CPU 90 executing the calculating program, CPU 90 functions as determining section 92. Determining section 92, based on the set pressure value and set time memorized on set value memory section 82, the pressure value inside space 68 detected by sensor 64, and the time elapsed since negative pressure generator 60 is turned on, determines whether the pressure inside space 68 is the set pressure value, so as to determine whether there is an error with the pressure inside space 68. Note that, determining section 92 is an example of an "error determining section".

Interface device 22 displays a setting state and work state of screen printing machine 10 to an operator via a monitor or the like, and receives various inputs from the operator via switches and the like. For example, interface device 22 is able to display to an operator determination results related to an error with the pressure inside space 68 using control device 20. Also, interface device 22 is able to receive inputs of a setting value set by an operator (for example, first set value and set time of that value, second set value and set time of that value, and third set value and set time of that value). Note that, interface device 22 is an example of an "input device".

Screen printing machine 10 is further provided with a loading conveyance device and an unloading conveyance device, not shown in the figures. The loading conveyance device receives a circuit board C sent from a board conveyance device upstream of screen printing machine 10, and loads the received circuit board C to X-direction conveyance mechanism 48 of circuit board positioning device 24. The unloading conveyance device receives a circuit board C unloaded from X-direction conveyance mechanism 48 of circuit board positioning device 24 and unloads the circuit board to a board conveyance device downstream of screen printing machine 10.

Figure 4:
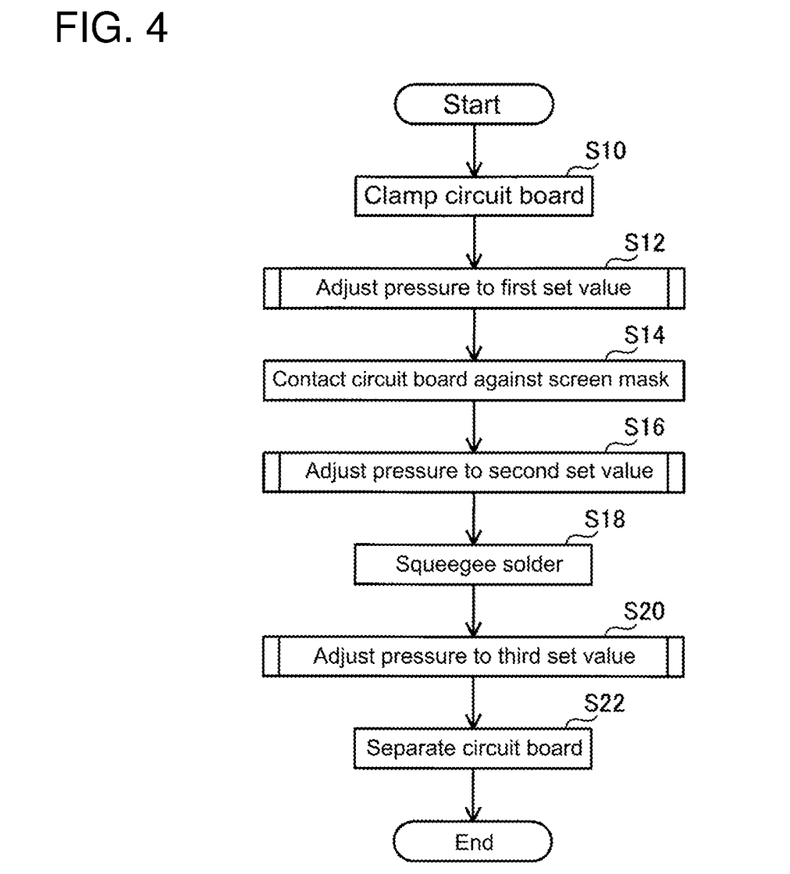
FIG. 4 is a flowchart showing an example of processing performed by the screen printing machine of the embodiment during printing processing.
Figure 5:
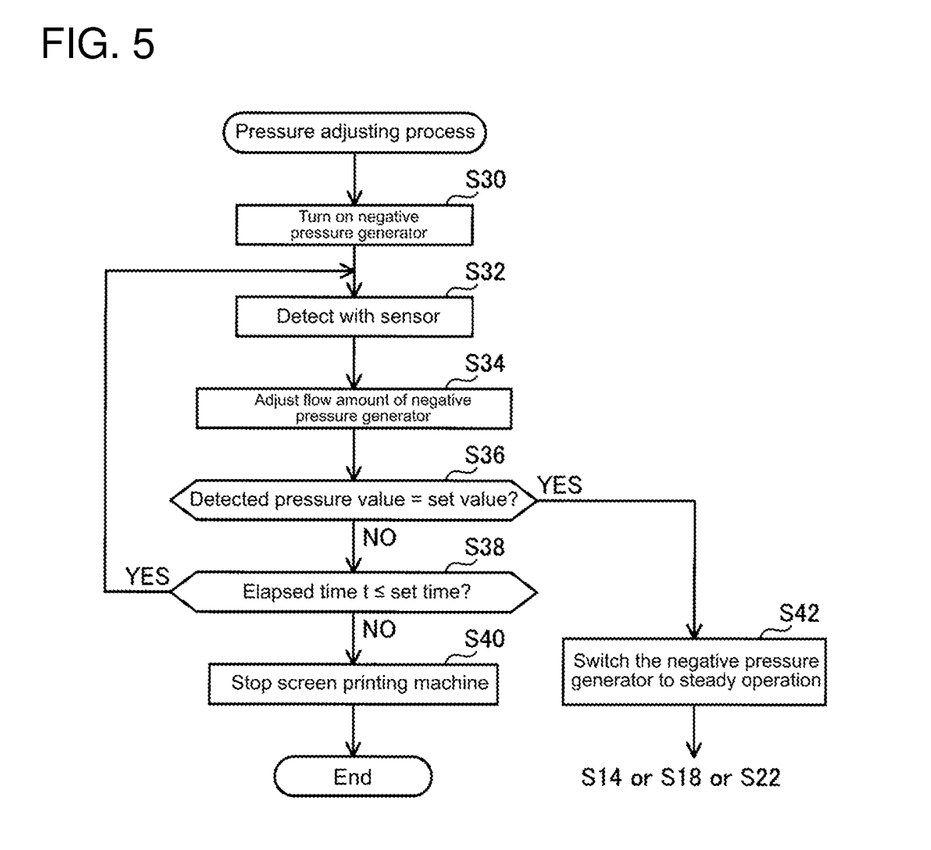
FIG. 5 is a flowchart showing an example of negative pressure adjustment processing using the negative pressure generating mechanism.

Referring to FIGS. 4 and 5, descriptions are given of screen printing machine 10 performing printing while the pressure inside space 68 is adjusted.

As shown in FIG. 4, first, control device 20 conveys circuit board C into screen printing machine 10 and clamps the circuit board C using clamp mechanism 50 (S10). Clamping processing of circuit board C by clamp mechanism 50 is performed with the following procedure. When a circuit board C is loaded from an upstream board conveyance device, control device 20 drives loading conveyor device to receive circuit board C. Then, control device 20 drives Y-direction moving mechanism 40, X-direction moving mechanism 42, rotating mechanism 44, and raising and lowering mechanism 46 to a position such that X-direction conveyance mechanism 48 can receive the circuit board C from the loading conveyance device. Then, control device 20 drives the loading conveyance device and X-direction conveyance device 48 to load circuit board C to X-direction conveyance mechanism 48 from the loading conveyance device. When the circuit board C has been loaded to X-direction conveyance mechanism 48, control device 20 drives X-direction conveyance mechanism 48 to convey the circuit board C to a position in the X direction corresponding to the printing pattern of screen mask 28. Continuing, control device 20 drives clamp mechanism 50 to hold circuit board C. Then, control device 20 drives bottom wall 56a of box member 56 using raising and lowering mechanism 46 such that circuit board C is supported from underneath by support pins.

When circuit board C has been clamped, control device 20 adjusts the pressure inside space 68 to be the first set value (S12). Here, processing of adjusting the pressure inside space 68 of S12 is described with reference to FIG. 5. As shown in FIG. 5, first, control device 20 turns on negative pressure generator 60 (S30). By turning on negative pressure generator 60, air inside space 68 is sucked and ejected from space 68 thereby creating negative pressure inside space 68.

When negative pressure generator is turned on, control device 20 acquires a pressure value inside space 68 detected by sensor 64 (S32). Then, control device 20 adjusts the flow amount of negative pressure generator 60 based on the pressure value inside space 68 acquired in S32 (S34). That is, control device 20 adjusts adjustment valve 66 to adjust the air flow amount being sucked from space 68. As described above, because multiple holes 12 are provided in circuit board C, when negative pressure generator 60 is turned on, air enters space 68 via holes 12. Control device 20 adjusts adjustment valve 66 such that the amount of air sucked from space 68 is larger than the amount of air entering via holes 12, so as to make the pressure inside space 68 the first set value.

Next, determining section 92 of control device 20 determines whether the pressure value inside space 68 acquired in S32 matches the first set value memorized inset value memory section 82 (S36). That is, control device determines whether the pressure inside space 68 is equal to the first set value. If the pressure value detected by sensor 64 and the first set value match (S36 is yes), control device 20 determines that the pressure value inside space 68 is the first set value, and switches negative pressure generator 60 to steady operation (S42). In other words, the output of negative pressure generator 60 is maintained at a constant level such that the pressure inside space 68 is maintained at the first set value. Further, the detected pressure value inside space 68 (that is, the pressure value matching the first set value) is memorized on detection value memory section 84. Then, processing proceeds to S14.

On the other hand, if the pressure value detected by sensor 64 and the first set value do not match (S36 is no), determining section 92, in S30, determines whether elapsed time t from when negative pressure generator 60 was turned on (also referred to simply as elapsed time t) is equal or shorter than a specified time corresponding to the first set value (S38).

In a case in which elapsed time t is equal to or shorter than the specified time (S38 is yes), determining section 92 determines that there is no error with negative pressure generator 60, and processing returns to S32. In a case in which elapsed time t has not reached the specified time, determining section 92 determines that not enough air inside space 68 is being sucked by negative pressure generator 60. That is, in S36, it is determined that the reason that the pressure value inside space 68 is not the first set value is that not enough air inside space 68 is being sucked by negative pressure generator 60. Thus, processing returns to S32 and processing of S32 to S36 is repeated.

On the other hand, in a case in which elapsed time t exceeds the specified time (S38 is no), determining section 92 determines that there is an error with negative pressure generating mechanism 54 and stops screen printing machine 10 (S40). That is, in a case in which the pressure value inside space 68 is not the first set value in S36 and elapsed time t exceeds the specified time in S38, determining section 92 determines that there is some kind of error with negative pressure generating mechanism 54. Examples of an error with negative pressure generating mechanism 54 include: a case in which a problem has occurred with negative pressure generator 60 or adjustment valve 66; and a case in which air from outside space 68 is entering space 68 due to damage to air flow path 62 or box member 56. Further, control device 20 displays a determination result related to the error on interface device 22 and sends it to a production management computer. Also, control device 20 printing processing is ended without returning to processing of FIG. 4.

If the pressure inside space 68 is adjusted to be the first set value in S12, warpage of circuit board C is appropriately corrected. If the pressure inside space 68 is less than the first set value in a state with circuit board C clamped by clamp mechanism 50, it is not possible to sufficiently correct the warpage in circuit board C. If circuit board C is warped, when circuit board C contacts the screen mask 28, circuit board C and screen mask 28 may not be suitably flush against each other, and a gap may arise between the circuit board C and screen mask 28. Further, if the pressure inside space 68 is larger than the first set value, excessive pressure is applied to the underside of circuit board C, and circuit board C may be damaged. In the present embodiment, in S12, by adjusting the pressure inside space 68 to the first set value, it is possible to appropriately correct warpage in circuit board C.

In S12, when the pressure inside space 68 is adjusted to be the first set value, control device 20 makes circuit board C contact screen mask 28 (S14). Processing of making circuit board C contact screen mask 28 is performed with the following procedure. First, control device 20 uses an imaging device (not shown) to perform imaging of the upper surface of circuit board C and imaging of the lower surface of screen mask 28. Control device 20 processes the image data captured by the imaging device and detects a position deviation between the circuit board C and screen mask 28. Upon detecting the position deviation, control device 20 performs fine adjustment of the position of circuit board C by driving Y-direction moving mechanism 40, X-direction moving mechanism 42, and rotating mechanism 44. Further, control device 20 drives raising and lowering mechanism 46 to raise circuit board C such that circuit board C contacts the lower surface of screen mask 28.

When circuit board C has contacted screen mask 28, control device 20 adjusts the pressure inside space 68 to be the second set value (S16). Note that, for S16, the procedure is similar to that of S12, so detailed descriptions are omitted. That is, in S16, processing of S30 to S42 shown in FIG. 5 is performed. However, in S16, it is determined whether the pressure value detected in S36 matches the second set value, and it is determined whether elapsed time t is equal to or less than a specified time corresponding to the second set value in step S38. In S42, if negative pressure generator 60 is switched to steady operation, the detected pressure inside space 68 (that is, the pressure value matching the second set value) is memorized in detection value memory section 84, then processing proceeds to S18.

In S16, if the pressure inside space 68 is adjusted to be the second set value, control device 20 squeegees the solder on the upper surface of screen mask 28 (S18). In detail, control device 20 supplies solder from a solder supply device onto the upper surface of screen mask 28. Upon solder being supplied onto the upper surface of screen mask 28, control device 20 drives one of the squeegee heads (for example, squeegee head 74a), contacts one of the squeegees (for example, squeegee 76a) against the upper surface of screen mask 28, then drives Y-direction moving mechanism 70 so as to perform squeegeeing with respect to the printing pattern of screen mask 28. When squeegeeing is complete, control device 20 drives squeegee heads 74a and 74b and Y-direction moving mechanism 70 to return squeegee device 30 to the squeegee device standby position.

Upon squeegeeing the solder on the upper surface of screen mask 28, solder is squeezed through apertures 29 provided in screen mask 28. Here, because the pressure inside space 68 is set to the second set value in S16, it is possible to squeeze an appropriate amount of solder through apertures 29. Circuit board C is held in contact with the lower surface of screen mask 28. Thus, solder is printed onto circuit board C in a pattern corresponding to the printing pattern of screen mask 28.

If the pressure inside space 68 is smaller than the second set value when the solder is squeegeed on the upper surface of screen mask 28, not enough negative pressure is created inside space 68, and a sufficient amount of solder may not be squeezed (sucked) through apertures 29 provided in screen mask 28. If the amount of solder squeezed through apertures 29 is insufficient, the amount of solder printed onto circuit board C will be smaller than the specified amount. Further, if the pressure inside space 68 is larger than the second set value, the amount of solder squeezed through apertures 29 may be greater than the appropriate amount. If the amount of solder squeezed through apertures 29 is too much, the amount of solder printed onto circuit board C will be greater than the specified amount, which may lead to smearing of the solder on circuit board C. In the present embodiment, the pressure inside space 68 is adjusted to be the second set value in S14, and squeegee processing is performed in S16. Thus, an appropriate amount of solder is squeezed through apertures 29.

When solder is squeezed through apertures 29 of screen mask 28 in S18, control device 20 adjusts the pressure inside space 68 to be the third set value. Note that, for S18, the procedure is similar to that of S12 to S14, so detailed descriptions are omitted. That is, in S16, processing of S30 to S42 shown in FIG. 5 is performed. However, in S20, it is determined whether the pressure value detected in S36 matches the third set value, and it is determined whether elapsed time t is equal to or less than a specified time corresponding to the third set value in step S38. In S42, if negative pressure generator 60 is switched to steady operation, the detected pressure inside space 68 (that is, the pressure value matching the third set value) is memorized in detection value memory section 84, then processing proceeds to S22.

Next, control device 20 separates circuit board C screen mask 28 (S22). In detail, control device 20 drives raising and lowering mechanism 46 to lower circuit board positioning device 24. In accordance with the lowering by raising and lowering mechanism 46, circuit board C is separated from screen mask 28. Because solder is squeezed into apertures 29 of screen mask 28, solder is transferred to the upper surface of circuit board C in a pattern corresponding to the printing pattern provided in screen mask 28. When circuit board C is separated from screen mask 28, because the pressure inside space 68 is made to be the third set value in S20, an appropriate amount of solder squeezed through apertures 29 is transferred to circuit board C.

If the pressure inside space 68 is smaller than the third set value when circuit board C is separated from screen mask 28, not enough negative pressure is created inside space 68, and a sufficient amount of solder cannot be squeezed through apertures 29 of screen mask 28. Thus, solder may remain inside apertures 29 of screen mask 28, such that an insufficient amount of solder is transferred onto circuit board C. Further, if the pressure inside space 68 is larger than the third set value, the amount of solder transferred onto circuit board C may be more than the appropriate amount. If the amount of solder transferred onto circuit board C is larger than the appropriate amount, this may cause smearing of the solder on circuit board C. In the present embodiment, the pressure inside space 68 is adjusted to be the third set value in S18, and separation processing of circuit board C is performed in S20. Thus, an appropriate amount of solder is transferred onto circuit board C.

When solder has been transferred onto circuit board C, control device 20 drives clamp mechanism 50 and lower wall 56a of box member 56 such that circuit board C is loaded again to X-direction conveyance mechanism 48. Further, control device 20 drives Y-direction moving mechanism 40, X-direction moving mechanism 42, and rotating mechanism 44 such to a position such that X-direction conveyance mechanism 48 can unload the circuit board C to the unloading conveyance device. Continuing, control device 20 drives X-direction conveyance device 48 and the loading conveyance device to unload circuit board C from X-direction conveyance mechanism 48 to the unloading conveyance device. Then, control device 20 drives the unloading conveyance device to unload the circuit board C to a downstream board conveyance device. Then, control device 20 ends printing processing.

Screen printing machine 10 of the present disclosure is provided with sensor 64 configured to detect the pressure inside space 68 formed by box member 56 and circuit board C, and detects the pressure applied to the underside of circuit board C by negative pressure generator 60. Further, by controlling the pressure inside space 68 based on the pressure value detected by sensor 64, it is possible to control the pressure inside space 68 to be stable. By screen printing machine 10 monitoring and controlling the pressure inside space 68, it is not necessary for an operator to perform pressure adjustment work (that is, adjustment work of the operating conditions). For example, there are cases in which the operating conditions for generating appropriate negative pressure are different for each screen printing machine due to individual differences in the screen printing machines. Accordingly, when an operator has to adjust the operating conditions, it takes a lot of time to decide the appropriate operating conditions. With screen printing machine 10 of the present embodiment, an operator simply has to set pressure values based on the size of apertures 29 of screen mask 28 or the like, and control device 20 controls the operating conditions of negative pressure generator 60. Thus, it is not necessary for an operator to perform adjustment work, and solder can be stably transferred onto circuit board C.

Note that, in the present embodiment, there is one space 68, but the configuration is not limited to this. For example, dividing plates with a Z-direction dimension substantially the same as side wall 56b and support pins 58 may be arranged inside space 68 to divide space 68 into multiple areas. For example, there are cases in which electronic components of different sizes are mounted on the same circuit board C. In such a case, the size of the apertures 29 in screen mask 28 differ within a single printing pattern. If the size of apertures 29 differs, the appropriate pressure for printing an appropriate amount of solder onto circuit board C differs. By dividing space 68 using dividing plates, it is possible to create different pressures in each of the divided spaces. Thus, it is possible to apply different sized pressures to match the printing pattern.

Technical elements described in this specification and in the drawings exhibit technical utility alone or in various combinations, and are not limited to the combination of the described aspects of the application. Also, the examples of the technology in this specification and the figures achieves multiple purposes at the same time but can also exhibit technical utility by achieving one among those purposes.

The invention claimed is:

1. A screen printing machine configured to print solder onto a surface of a circuit board using a screen mask, the screen printing machine comprising:
a screen mask arranged at a top side of the circuit board;
a box member arranged at an underside of the circuit board including a space that is closed by the circuit board;
a negative pressure generator connected to the space of the box member and configured to create negative pressure inside the space;
a sensor configured to detect a pressure inside the space;
a control device configured to control the negative pressure generator based on the pressure detected by the sensor; and
a solder amount acquiring section configured to acquire information related to an amount of solder printed on the circuit board,
wherein the control device is configured to control the negative pressure generator also based on the information acquired by the solder amount acquiring section.

2. The screen printing machine according to claim 1, further comprising
an air flow path connecting the space of the box member and the negative pressure generator, and
an adjustment valve arranged inside the air flow path and configured to adjust an open area of the air flow path, wherein
the control device is configured to control the adjustment valve based on the pressure detected by the sensor.

3. The screen printing machine according to claim 1, further comprising
an input section configured to receive an input of a set pressure value,
wherein
the control device controls the negative pressure generator such that a pressure value of the pressure detected by the sensor is the set pressure value.

4. The screen printing machine according to claim 3, further comprising
a clamp device configured to clamp the circuit board loaded on an upper surface of the box member such that the circuit board cannot move relative to the box member;
a raising and lowering device configured to raise and lower the circuit board loaded on the upper surface of the box member with respect to the screen mask; and
a printing device configured to print solder onto the circuit board via the screen mask in a state with the screen mask arranged on the surface of the circuit board loaded on the upper surface of the box member,
wherein
the set pressure value is able to be classified as a first set value set as the pressure value inside the space when the circuit board is clamped by the clamp device, a second set value set as the pressure value inside the space when solder is being printed onto the circuit board by the printing device, and a third set value set as the pressure value inside the space when the circuit board is separated from the screen mask by the raising and lowering device,
the input section is configured to receive an input of the first set value, the second set value, and the third set value, and
the control device is configured to perform control such that the pressure inside the space when the circuit board is clamped by the clamp device makes the pressure value inside the space the first set value, perform control such that the pressure inside the space when solder is being printed onto the circuit board by the printing device makes the pressure value inside the space the second set value, and perform control such that the pressure inside the space when the circuit board is separated from the screen mask by the raising and lowering device makes the pressure value inside the space the third set value.

5. The screen printing machine according to claim 1, further comprising
an error determining section configured to determine an error based on the pressure value detected by the sensor and the set pressure value.

6. The screen printing machine according to claim 5, wherein
the error determining section is configured to determine the error when a difference between the pressure value detected by the sensor and the set pressure value exceeds a predetermined set range.

7. The screen printing machine according to claim 1, further comprising
a memory section configured to memorize the pressure value detected by the sensor during printing processing each time solder is printed on the circuit board.

8. A screen printing machine configured to print solder onto a surface of a circuit board using a screen mask, the screen printing machine comprising:
a screen mask arranged at a top side of the circuit board;
a box member arranged at an underside of the circuit board including a space that is closed by the circuit board;
a negative pressure generator connected to the space of the box member and configured to create negative pressure inside the space;
a sensor configured to detect a pressure inside the space;
a control device configured to control the negative pressure generator based on the pressure detected by the sensor;
an input section configured to receive an input of a set pressure value;
a clamp device configured to clamp the circuit board loaded on an upper surface of the box member such that the circuit board cannot move relative to the box member;
a raising and lowering device configured to raise and lower the circuit board loaded on the upper surface of the box member with respect to the screen mask; and
a printing device configured to print solder onto the circuit board via the screen mask in a state with the screen mask arranged on the surface of the circuit board loaded on the upper surface of the box member,
wherein
the control device controls the negative pressure generator such that a pressure value of the pressure detected by the sensor is the set pressure value,
the set pressure value is able to be classified as a first set value set as the pressure value inside the space when the circuit board is clamped by the clamp device, a second set value set as the pressure value inside the space when solder is being printed onto the circuit board by the printing device, and a third set value set as the pressure value inside the space when the circuit board is separated from the screen mask by the raising and lowering device,
the input section is configured to receive an input of the first set value, the second set value, and the third set value, and
the control device is configured to perform control such that the pressure inside the space when the circuit board is clamped by the clamp device makes the pressure value inside the space the first set value, perform control such that the pressure inside the space when solder is being printed onto the circuit board by the printing device makes the pressure value inside the space the second set value, and perform control such that the pressure inside the space when the circuit board is separated from the screen mask by the raising and lowering device makes the pressure value inside the space the third set value.

\* \* \* \* \*